Jan. 4, 1966 E. A. WOLFF, JR 3,226,798

NOVEL DIFFUSED BASE TRANSISTOR DEVICE AND METHOD OF MAKING SAME

Filed April 13, 1960 3 Sheets-Sheet 1

INVENTOR
Elmer A. Wolff, Jr.

BY Stevens, Davis, Miller & Mosher
ATTORNEYS

INVENTOR
Elmer A. Wolff, Jr.
BY Stevens, Davis, Miller & Mosher
ATTORNEYS

Jan. 4, 1966

E. A. WOLFF, JR 3,226,798

NOVEL DIFFUSED BASE TRANSISTOR DEVICE AND METHOD OF MAKING SAME

Filed April 13, 1960

3 Sheets-Sheet 3

INVENTOR

Elmer A. Wolff, Jr.

BY Stevens, Davis, Miller & Mosher

ATTORNEYS

United States Patent Office 3,226,798 Patented Jan. 4, 1966

3,226,798

NOVEL DIFFUSED BASE TRANSISTOR DEVICE AND METHOD OF MAKING SAME

Elmer A. Wolff, Jr., Richardson, Tex., assignor to Texas Instruments Incorporated, Dallas, Tex., a corporation of Delaware Filed Apr. 13, 1960, Ser. No. 21,998
1 Claim. (Cl. 29—25.3)

This invention relates to semiconductor devices, and more particularly, to semiconductor devices of the type known as diffused base transistors and to a novel method of fabricating such devices.

Diffused junction transistor devices of the type having a base region formed by diffusing an active conductivity affecting impurity into a semiconductor body are well known in the art. It is also recognized that to produce high frequency characteristics in such a transistor device, it is desirable to have the base-collector and base-emitter junctions confined to as small an area as possible. This is achieved by appropriate etching techniques whereby all undesired portions of the base layer are etched away. In one type of high frequency, diffused base device, the junction areas remaining are contained in a mesa having a top surface just large enough to accommodate the base and emitter contacts.

Another fabrication technique which has recently achieved prominence in transistor technology is that of electrolytic etching. The limitations on etching methods imposed by the extremely small dimensions involved in transistor work make exact control of the etchant at all times, and careful and adequate masking of areas to be protected, of the utmost importance. Electrolytic etching used in conjunction with depletion layer characteristics has provided an efficient means for producing semiconductor bodies of predetermined configuration. Because of the resistance characteristics of the depletion layer adjacent a rectifying junction, the etching process is arrested when this depletion layer is reached. When a reverse bias is applied across the rectifying junction the width of the depletion layer is increased. It is therefore possible to control the distance from the rectifying barrier at which etching will be arrested by controlling the magnitude of the potential used in reversing the bias across the junction.

Theses concepts have been employed in the past to etch away the base region adjacent a junction in order to reduce the base resistance.

However, as far as is known, the electrolytic etching technique has not been previouly employed in conjunction with electroplating to make a diffused base transistor of the type constituting this invention.

The collector saturation resistance of a transistor is directly related to the bulk or volume of semiconductor material in the collector region through which the current must flow in passing from the base-collector junction to the collector contact or lead.

The storage time of the device is also a function of the thickness or bulk of the collector and is considerably improved when the distance between collector contact and collector-base junction is reduced.

In high frequency diffused base transistors of the type previously discussed it is essential that junctions and contacts be parallel with one another for efficient high frequency operation.

The present invention, therefore, contemplates the fabrication of a diffused base transistor device having excellent high frequency characteristics, and low collector bulk resistance by virtue of a very thin portion of collector semiconductor material separating the base-collector junction from the collector contact, and characterized by a plated collector contact which is exactly parallel to the junction at that portion of the contact which is closest to the junction.

The process for making the novel transistor of the present invention, which process is in itself considered to present useful and novel aspects, consists broadly in mounting a diffused base transistor upon one leg of a support, such as a "G"-frame, centering the surface of the collector region over a hole or aperture in the "G"-frame leg, mounting the "G"-frame and transistor in inverted position in a header so that the collector surface is exposed from above through the hole in the leg of the "G"-frame, directing a stream of electrolytic etchant through the hole in the "G"-frame leg and against the exposed surface of the collector and thereby etching a cavity in the collector body which has a depth which differs from the thickness of the collector region only by a distance equal to the width of the depletion layer adjacent the diffused junction between base and collector, and finally, reversing the polarity of the etching potential to plate a collector contact in the cavity thus formed, and on the "G"-frame leg.

Accordingly, it is an object of the present invention to provide a novel transistor device capable of efficient high frequency operation.

It is a further object of this invention to fabricate a transistor having a low collector saturation resistance.

Another object of the present invention is to provide a diffused base type transistor having minimum collector bulk interposed between the diffused collector-base junction and the collector contact.

A further object is to provide an improved method for mounting a completed transistor preparatory to submitting it to electrolytic etching.

An additional object of this invention is to provide a transistor with an electroplated collector contact.

Another object is to provide a diffused base transistor in which the diffused junction between the collector and base regions of the transistor is separated from the collector contact by a distance equivalent to the width of the depletion layer adjacent the diffused junction and in which the collector contact lies parallel to the collector-base junction in the area of their nearest approach.

Other objects and advantages of the invention will become more apparent from the following detailed description of a preferred embodiment of the present invention when considered in conjunction with the appended drawings in which.

Figures 7, 11:
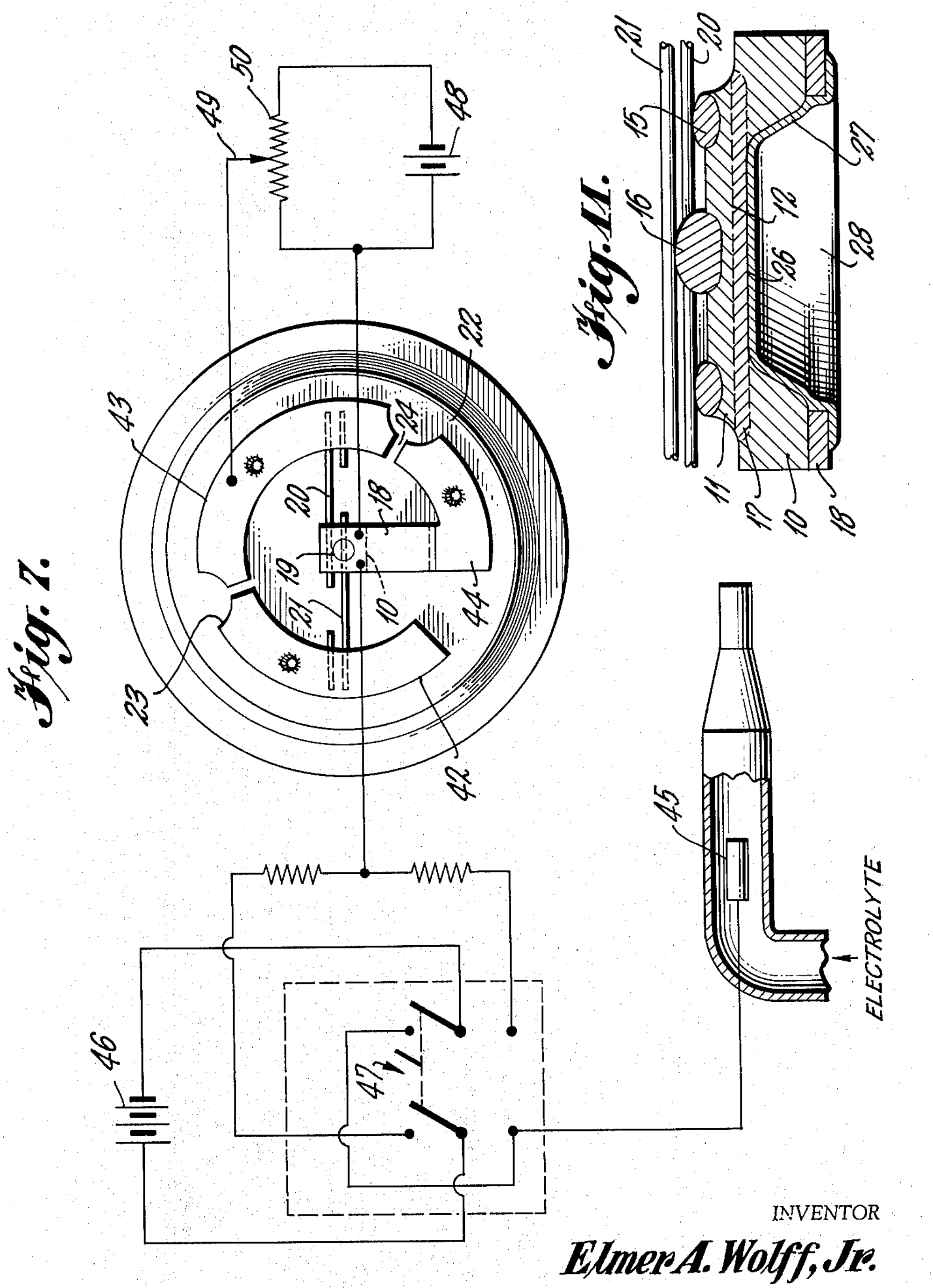
Figure 8:
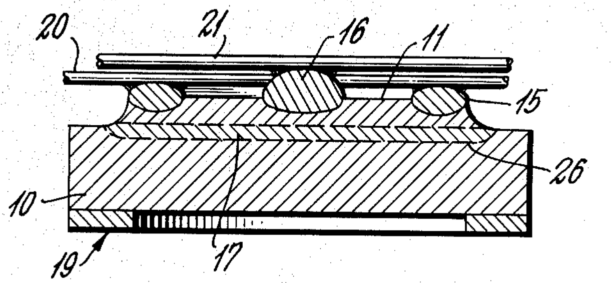
Figure 9:
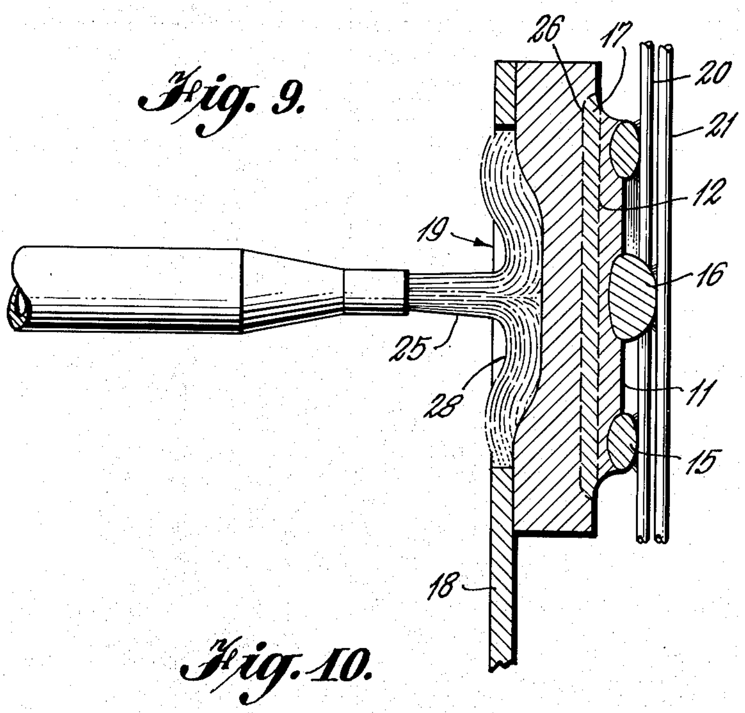

FIGURE 7 schematically depicts an electrical circuit utilized in electrolytically etching and plating the transistor wafer;

FIGURE 8 is a cross-section taken through the center of the transistor element after it has been mounted on the "G"-frame with leads attached;

FIGURE 9 is a sectional view showing the "G"-frame-mounted diffused base transistor being submitted to electrolytic etching.

Figure 10:
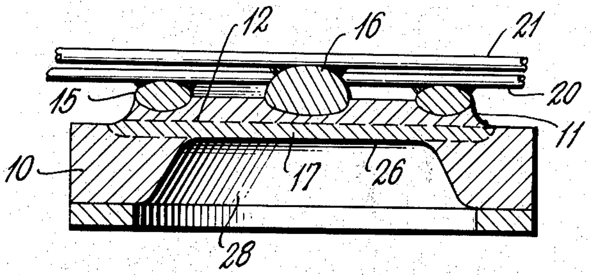

FIGURE 10 is a cross-section through the transistor element similar to FIGURE 8 showing the cavity etched by the electrolyte in the collector of the diffused base transistor;

FIGURE 11 is a cross-section similar to that shown in FIGURE 10 showing the collector contact plated in the etched cavity.

For clarity, the description of the invention will be confined to a consideration of a single preferred embodiment of the present invention. It will be appreciated, however, that the principles here set forth with respect to fabrication of the preferred embodiment shown may be applied to other types of transistors and that other and novel transistor types may be constructed in accordance with the method here described. Such changes and modifications, if embodying the concepts of the invention, are considered to be within the purview of the invention.

Figure 1:
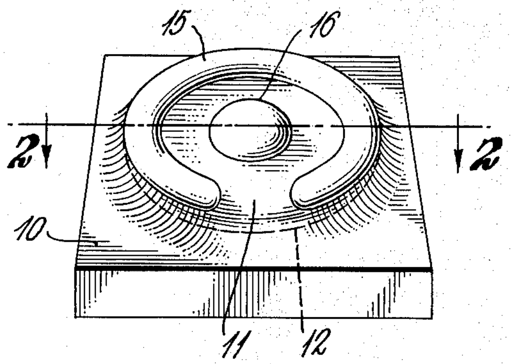
FIGURE 1 is a perspective view of a typical diffused base transisor device prior to attachment of the electrical leads.

Referring now to the drawings, there is illustrated in FIGURE 1, in perspective, a transistor device consisting of a wafer portion 10 having formed on the top surface thereof a mesa or plateau 11. A diffused junction is defined in the mesa 11 as indicated by the reference numeral 12. The wafer portion 10 is of either N or P type conductivity containing therein a suitable active impurity. The semiconductor material for the transistor is either silicon, germanium or any other suitable material useful for this purpose. The region above the junction 12 is characterized by a conductivity opposite in type to the conductivity of wafer 10. Contact is made to the region 11 above junction 12 by means of a horseshoe-shaped contact 15. Centrally contained within the horseshoe-shaped contact 15 and attached to the mesa 11 is a dot 16. The dot 16 functions as an emitter contact and the horseshoe-shaped contact 15 functions as a base contact. Junction 12 functions as the base-collector junction. Dot 16 contains an active impurity of the same conductivity-producing type as contained in wafer 10 and is alloyed to the mesa 11 to form an alloyed base-emitter junction. The wafer 10 forms the collector of the device.

Figure 2:
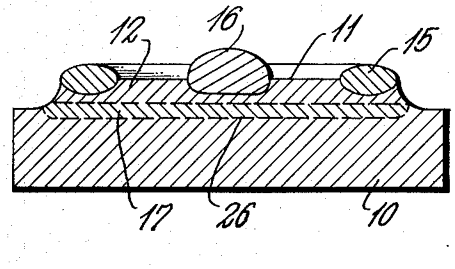
FIGURE 2 is a view in section taken along the line 2—2 of FIGURE 1.

FIGURE 2 illustrates more clearly the mesa 11, diffused junction 12, the collector 10, and the base and emitter contacts 15 and 16. By further reference to FIGURE 2, a zone 17, called the depletion layer, is defined within the collector 10. It will be observed that the depletion layer 17 is adjacent the diffused junction 12. A depletion layer is essentially a region adjacent a P-N junction in which the density of mobile carriers is low and across which there exists a small electrostatic potential in the absence of applied potential. The importance of this depletion layer in electrolytic etching is well recognized in the art, and its role in the fabrication of the novel transistor of the present invention will be discussed in greater detail hereinafter.

Figure 3:
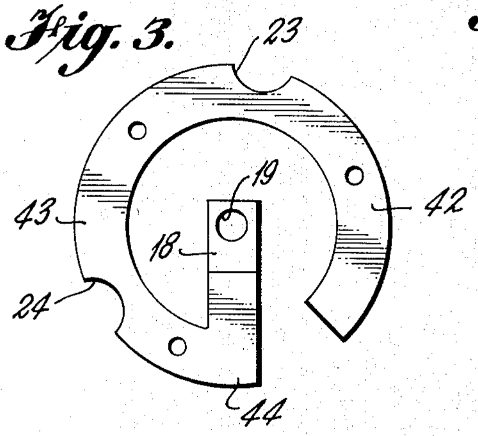
FIGURE 3 is a plan view of a "G"-frame constructed in accordance with the method of this invention and prior to mounting the difused base transistor element thereon.
Figure 5:
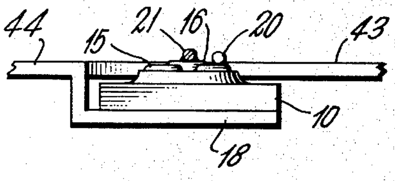
FIGURE 5 is a section taken on line 5—5 of FIGURE 4.

In FIGURE 3 there is depicted a "G"-frame of the type used for mounting the transistor element while attaching the leads thereto. This "G"-frame is substantially of the same design as that described in the pending application Serial No. 715,040 of Cornelison et al., filed February 13, 1958. The periphery of the "G"-frame is recessed at 23 and 24 and thus may be said to consist of three segments 42, 43, and 44. Segment 44 carries a stepped limb 18 which projects inside the "G." (See FIGURE 5.) A hole or aperture 19 is defined within the limb 18 of the "G"-frame near the end of limb 18.

Figure 4:
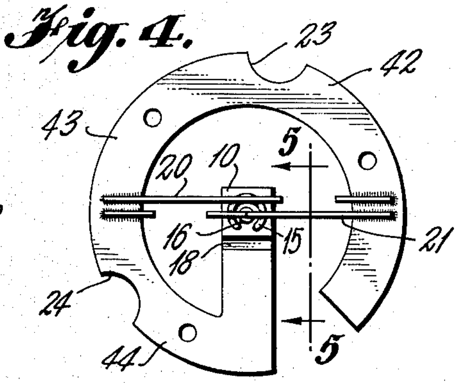
FIGURE 4 is a plan view similar to FIGURE 3 but showing the transistor element mounted thereon with leads attached.

The device illustrated in FIGURES 1 and 2 is mounted on the end of limb 18 of the "G"-frame, and the bottom surface of the collector 10 is centered over the hold 19, as shown in FIGURE 4. While the transistor element is thus mounted, leads 20 and 21 are attached to the base and emitter contacts, respectively and to "G"-frame segments 42 and 43. The leads 20 and 21 are then severed in one place between the contacts and the "G"-frame, as shown in FIGURE 4.

Figure 6:
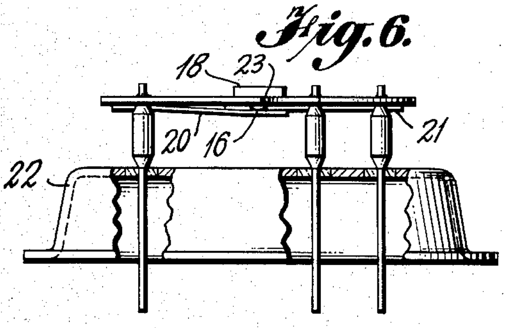
FIGURE 6 is a view in elevation of the inverted "G"-frame carrying the transistor element and mounted in a header.

Following the attachment of the leads to base and emitter contacts, the "G"-frame is mounted upside down in a header 22, as shown in plan view of FIGURE 7 and in elevation in FIGURE 6. By "upside down" is meant in a position with the emitter and base contacts facing downward toward the header. By reference to FIGURE 7 it will be seen that when the "G"-frame and its mounted transistor element are so located with respect to the header, the lower surface of the collector 10 is accessible through the hole 19 in limb 18 of the "G"-frame.

After inverted mounting in the header 22, the "G"-frame is severed at the peripheral recesses 23 and 24, as described in application Serial No. 715,040 of Cornelison et al., referred to above.

The collector surface is now ready to be electrolytically etched in accordance with known techniques. As shown in FIGURE 9, a stream of etchant 25 is directed through the hole 19 in the limb 18 of the "G"-frame and against the surface of collector 10. Etching is accomplished by applying a potential difference of proper polarity between an inert electrode 45 immersed in the stream of electrolyte and the collector contact which is actually the limb 18 of the "G"-frame, as shown in FIGURE 7. As shown in this figure, a source of potential 46 supplies the current for etching and also for plating, depending upon whether the switch 47 is in the up or down position.

During the etching, a reverse bias is applied across the diffused junction 12 between the base and collector regions of the transistor element. As is well known in the art, application of the reverse bias across the junction changes the electrostatic potential across the depletion layer associated with the junction and widens the depletion layer. It is also known that by widening the depletion layer associated with a rectifying junction, the distance from the junction at which the etching is arrested may be correspondingly increased.

An electrical circuit for applying a reverse bias across the base-collector junction depletion layer is depicted in FIGURE 7. A potential source 48 supplies a voltage which may be regulated by manipulation of the tap 49 on resistor 50. The width of the depletion layer is increased by increasing the magnitude of the reverse bias.

In FIGURE 8, the approximate boundary of the depletion layer 17 adjacent the base-collector junction 12 after the layer has been widened by the application of reverse bias to the junction is represented by a dotted line 26.

Etching of the collector is continued until a cavity 28 is produced to a depth equivalent to the distance between the collector surface and the depletion layer boundary. The width of the depletion layer may, by control of the reverse bias, be varied between 0.1 and 0.5 mils as desired. Continued etching after this time results in a widening of the cavity without further increase in its depth. When the width of the cavity is approximately coextensive with the width of the diffused base region, etching is discontinued. At this point the transistor element in cross-section appears as shown in FIGURE 10. By reference to this figure it will be seen that the bottom of the cavity 28 is parallel to the base-collector junction 12.

After etching has been discontinued, the polarity of the etching potential is reversed and electroplating will take place in the collector cavity. It is proposed by the present invention to plate in this manner a metallic collector contact 27 which will form a path of electrical conduction from that portion of the collector at the bottom of the cavity and adjacent the depletion layer to the limb 18 of the "G"-frame. To this end an appropriate metal salt solution should be used as the electrolyte. For example, the plated collector contact may consist of indium, gold, gold-gallium, or gold-antimony. The finished transistor element, following electroplating of the collector contact, appears as shown in FIGURE 11. It will be readily perceived that as a result of the controlled electrolytic etching and plating, a substantial portion of the collector body has been removed and the collector contact has been positioned very close to the base-collector junction.

The advantages inherent in a transistar fabricated according to the present invention will be apparent to those skilled in the art. The collector saturation resistance will be reduced significantly in the novel transistor of this invention since the current through the transistor need travel only a short path through the body fo the collector before reaching the collector contact. It has been found that in the particular type of diffused junction transistor illustrated the collector saturation resistance is reduced by ½ to ⅓ as a result of the removal of the collector bulk by etching.

Although the arrangement described hereinabove is considered a preferred embodiment of the invention, it will be appreciated that other arrangements are possible which do not depart from the novel concepts herein taught. Thus, various other changes and modifications such as are obvious to one skilled in the art are deemed to be within the spirit, scope and contemplation of the present invention.

What is claimed is:

The method of fabricating a diffused base transistor comprising, (a) diffusing impurities of one conductivity type into one face of a semiconductor wafer of opposite type, thereby forming a collector region and a base region defining a first P-N junction;

(b) introducing impurities of said opposite conductivity type into said base region, thereby forming an emitter region defining a second P-N junctioin in said wafer;

(c) fusing a first ohmic metallic layer to the second face of the wafer on the collector region, the metallic layer defining a central exposed area on the collector region;

(d) simultaneously applying a reverse bias across said first P-N junction and directing a stream of electrolytic etching solution against said central exposed area, the reverse bias providing a depletion region in the collector region adjacent the first P-N junction, the depletion region acting to terminate the electrolytic etching in the collector region when the recess formed thereby has reached the depletion region thus forming a depressed collector contact area; and (e) applying a second ohmic metallic layer over said depressed collector contact area, the second metallic layer engaging the first metallic layer to provide a low resistance collector connection.

References Cited by the Examiner

UNITED STATES PATENTS

| | | | |
|---|---|---|---|
| 2,843,809 | 7/1958 | Varela | 317—235 |
| 2,846,346 | 8/1958 | Bradley | 148—33 |
| 2,885,609 | 5/1959 | Williams et al. | 317—235 |
| 2,947,923 | 8/1960 | Pardue | 317—235 |
| 2,947,924 | 8/1960 | Pardue | 317—235 |
| 2,983,633 | 5/1961 | Bernardi et al. | 317—235 |
| 2,999,964 | 9/1961 | Glickman | 317—234 |
| 3,061,766 | 10/1962 | Kelley | 317—234 |

JOHN W. HUCKERT, *Primary Examiner.*

SAMUEL BERNSTEIN, JOHN W. HUCKERT, DAVID J. GALVIN, *Examiners.*